(12) United States Patent
Dhindsa et al.

(10) Patent No.: US 9,508,530 B2
(45) Date of Patent: Nov. 29, 2016

(54) PLASMA PROCESSING CHAMBER WITH FLEXIBLE SYMMETRIC RF RETURN STRAP

(71) Applicant: Lam Research Corporation, Fremont, CA (US)

(72) Inventors: Rajinder Dhindsa, Fremont, CA (US); Mike Kellogg, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 680 days.

(21) Appl. No.: 13/684,098

(22) Filed: Nov. 21, 2012

(65) Prior Publication Data

US 2013/0133834 A1 May 30, 2013

Related U.S. Application Data

(60) Provisional application No. 61/563,545, filed on Nov. 24, 2011.

(51) Int. Cl.
*H01L 21/67* (2006.01)
*H01L 21/683* (2006.01)
*H01J 37/32* (2006.01)

(52) U.S. Cl.
CPC .... *H01J 37/32091* (2013.01); *H01J 37/32541* (2013.01); *H01J 37/32715* (2013.01); *H01L 21/67069* (2013.01); *H01L 21/6831* (2013.01)

(58) Field of Classification Search
CPC . C23C 14/50; C23C 14/564; C23C 16/4401; C23C 16/4404; C23C 16/458; C23C 16/4583; C23C 16/4585; C23C 16/505–16/5096; H01L 21/67069; H01L 21/6831; H01L 21/6833; H01L 21/68785; H01L 21/68792; H01J 37/32082–37/32183; H01J 37/32477; H01J 37/32495; H01J 37/32504; H01J 37/32623; H01J 37/32697; H01J 37/32706; H01J 37/32715; H01J 37/32541
See application file for complete search history.

(56) References Cited

U.S. PATENT DOCUMENTS

| | | |
|---|---|---|
| 4,340,462 A | 7/1982 | Koch |
| 5,183,990 A | 2/1993 | Enyedy |

(Continued)

FOREIGN PATENT DOCUMENTS

| | | |
|---|---|---|
| EP | 1155164 B1 | 7/2010 |
| JP | 5166595 | 7/1993 |

(Continued)

OTHER PUBLICATIONS

PCT International Search Report and Written Opinion of the International Searching Authority (ISA) issued in International Application No. PCT/2012/066425, United States Patent and Trademark Office, Feb. 22, 2013.

(Continued)

*Primary Examiner* — Karla Moore
*Assistant Examiner* — Benjamin Kendall
(74) *Attorney, Agent, or Firm* — Martine Penilla Group, LLP

(57) ABSTRACT

Chambers for processing semiconductor wafers are provided. One such chamber includes an electrostatic chuck having a surface for supporting a substrate. A ground assembly is provided that surrounds a periphery of the electrostatic chuck. The ground assembly includes a first annular part and a second annular part and a space between the first annular part and the second annular part. A conductive strap having flexibility is provided. The conductive strap is annular and has a curved cross-sectional shape with a first end and a second end. The conductive strap is disposed in the space such that the first is electrically connected to the first annular part and the second end is electrically connected to the second annular part. The curved cross-sectional shape has an opening that faces away from the electrostatic chuck when the annular conductive strap is in the space.

17 Claims, 5 Drawing Sheets

(56) References Cited

U.S. PATENT DOCUMENTS

| | | | |
|---|---|---|---|
| 5,304,250 A | 4/1994 | Sameshima et al. | |
| 5,349,271 A | 9/1994 | Van Os et al. | |
| 5,620,524 A | 4/1997 | Fan et al. | |
| 5,689,215 A | 11/1997 | Richardson et al. | |
| 5,889,252 A | 3/1999 | Williams et al. | |
| 5,968,587 A | 10/1999 | Frankel | |
| 5,998,933 A | 12/1999 | Shun'ko | |
| 6,023,405 A | 2/2000 | Shamouilian et al. | |
| 6,150,628 A | 11/2000 | Smith et al. | |
| 6,221,221 B1* | 4/2001 | Al-Shaikh et al. | 204/298.02 |
| 6,261,408 B1* | 7/2001 | Schneider et al. | 156/345.26 |
| 6,264,788 B1 | 7/2001 | Tomoyasu et al. | |
| 6,302,964 B1 | 10/2001 | Umotoy et al. | |
| 6,302,965 B1 | 10/2001 | Umotoy et al. | |
| 6,335,293 B1 | 1/2002 | Luo et al. | |
| 6,337,460 B2 | 1/2002 | Kelkar et al. | |
| 6,392,351 B1 | 5/2002 | Shun'ko | |
| 6,432,260 B1 | 8/2002 | Mahoney et al. | |
| 6,494,958 B1 | 12/2002 | Shamouilian et al. | |
| 6,527,911 B1* | 3/2003 | Yen et al. | 156/345.43 |
| 6,528,751 B1 | 3/2003 | Hoffman et al. | |
| 6,557,248 B1 | 5/2003 | Shamaoulian et al. | |
| 6,646,233 B2 | 11/2003 | Kanno et al. | |
| 6,825,618 B2 | 11/2004 | Pu et al. | |
| 6,855,906 B2 | 2/2005 | Brailove | |
| 6,872,259 B2 | 3/2005 | Strang | |
| 6,924,455 B1 | 8/2005 | Chen et al. | |
| 7,363,876 B2 | 4/2008 | Lai et al. | |
| 7,393,432 B2 | 7/2008 | Dhindsa et al. | |
| 7,581,511 B2 | 9/2009 | Mardian et al. | |
| 7,619,179 B2 | 11/2009 | Hayashi | |
| 7,683,289 B2 | 3/2010 | Dhindsa et al. | |
| 7,712,434 B2 | 5/2010 | Dhindsa et al. | |
| 7,722,778 B2* | 5/2010 | Fischer et al. | 216/59 |
| 7,829,815 B2 | 11/2010 | Chen et al. | |
| 7,939,778 B2 | 5/2011 | Larson et al. | |
| 8,012,306 B2 | 9/2011 | Dhindsa | |
| 8,056,503 B2 | 11/2011 | Kikuchi et al. | |
| 8,293,068 B2 | 10/2012 | Koshimizu et al. | 156/345.47 |
| 8,485,128 B2 | 7/2013 | Kellogg et al. | |
| 8,522,716 B2 | 9/2013 | Kadkhodayan et al. | 118/723.1 |
| 8,552,334 B2 | 10/2013 | Tappan et al. | 219/121.48 |
| 8,618,446 B2 | 12/2013 | Chang et al. | |
| 8,674,255 B1 | 3/2014 | Lenz et al. | |
| 8,735,765 B2 | 5/2014 | Tappan et al. | 219/121.48 |
| 8,906,197 B2 | 12/2014 | Dhindsa | |
| 2001/0000104 A1 | 4/2001 | Li et al. | |
| 2001/0002582 A1 | 6/2001 | Dunham et al. | |
| 2001/0047760 A1 | 12/2001 | Moslehi | |
| 2002/0102858 A1* | 8/2002 | Wicker et al. | 438/731 |
| 2002/0108714 A1 | 8/2002 | Doering et al. | |
| 2002/0170881 A1 | 11/2002 | Benzing et al. | |
| 2002/0197402 A1 | 12/2002 | Chiang et al. | |
| 2003/0000473 A1 | 1/2003 | Chae et al. | |
| 2003/0015965 A1 | 1/2003 | Godyak | |
| 2003/0027428 A1 | 2/2003 | Ng et al. | |
| 2003/0029567 A1 | 2/2003 | Dhindsa et al. | |
| 2003/0031794 A1 | 2/2003 | Tada et al. | |
| 2003/0071035 A1 | 4/2003 | Brailove | |
| 2003/0094903 A1 | 5/2003 | Tao et al. | |
| 2003/0098372 A1 | 5/2003 | Kim | |
| 2003/0136766 A1 | 7/2003 | Hoffman et al. | |
| 2003/0137251 A1 | 7/2003 | Mitrovic et al. | |
| 2003/0188685 A1 | 10/2003 | Wang et al. | |
| 2004/0003777 A1 | 1/2004 | Carpenter et al. | |
| 2004/0027781 A1 | 2/2004 | Hanawa et al. | |
| 2004/0040502 A1 | 3/2004 | Basceri et al. | |
| 2004/0040503 A1 | 3/2004 | Basceri et al. | |
| 2004/0047720 A1 | 3/2004 | Lerner et al. | |
| 2004/0083961 A1 | 5/2004 | Basceri | |
| 2004/0149699 A1 | 8/2004 | Hofman et al. | |
| 2004/0175953 A1 | 9/2004 | Ogle | |
| 2004/0178180 A1 | 9/2004 | Kaji et al. | |
| 2004/0226507 A1 | 11/2004 | Carpenter et al. | |
| 2005/0000655 A1 | 1/2005 | Wi | |
| 2005/0001556 A1 | 1/2005 | Hoffman et al. | |
| 2005/0006028 A1 | 1/2005 | Keil et al. | |
| 2005/0023254 A1 | 2/2005 | Hayashi et al. | |
| 2005/0087302 A1 | 4/2005 | Mardian et al. | |
| 2005/0160985 A1 | 7/2005 | Brcka | |
| 2005/0184670 A1 | 8/2005 | Lacoste et al. | |
| 2005/0194100 A1 | 9/2005 | Or et al. | |
| 2005/0217582 A1 | 10/2005 | Kim et al. | |
| 2005/0264218 A1 | 12/2005 | Dhindsa et al. | |
| 2005/0268856 A1 | 12/2005 | Miller et al. | |
| 2006/0060302 A1 | 3/2006 | White et al. | |
| 2006/0065623 A1 | 3/2006 | Guiney et al. | |
| 2006/0075969 A1 | 4/2006 | Fischer | |
| 2006/0081564 A1 | 4/2006 | Moroz et al. | |
| 2006/0118518 A1 | 6/2006 | Rusu et al. | |
| 2006/0237138 A1 | 10/2006 | Qin | |
| 2007/0081295 A1 | 4/2007 | Brillhart et al. | |
| 2007/0170155 A1 | 7/2007 | Fink | |
| 2007/0193688 A1 | 8/2007 | Dhindsa et al. | |
| 2007/0199658 A1 | 8/2007 | Dhindsa et al. | |
| 2007/0235420 A1 | 10/2007 | Yamazawa | |
| 2007/0235426 A1 | 10/2007 | Matsumoto et al. | |
| 2007/0251642 A1 | 11/2007 | Bera et al. | |
| 2008/0020574 A1 | 1/2008 | Marakhtanov et al. | |
| 2008/0041820 A1 | 2/2008 | Tong et al. | |
| 2008/0149596 A1* | 6/2008 | Dhindsa et al. | 216/67 |
| 2008/0171444 A1* | 7/2008 | Dhindsa et al. | 438/729 |
| 2008/0173237 A1 | 7/2008 | Collins et al. | |
| 2008/0179007 A1 | 7/2008 | Collins et al. | |
| 2008/0274297 A1 | 11/2008 | Furuta et al. | |
| 2008/0286697 A1 | 11/2008 | Verhaverbeke et al. | |
| 2008/0302652 A1 | 12/2008 | Entley et al. | |
| 2008/0302781 A1 | 12/2008 | Murakami et al. | |
| 2009/0025879 A1 | 1/2009 | Rauf et al. | |
| 2009/0066315 A1 | 3/2009 | Hu et al. | |
| 2009/0109595 A1 | 4/2009 | Herchen et al. | |
| 2009/0149028 A1 | 6/2009 | Marakhtanov et al. | |
| 2009/0200268 A1 | 8/2009 | Tappan et al. | 216/67 |
| 2009/0200269 A1* | 8/2009 | Kadkhodayan et al. | 216/71 |
| 2009/0242135 A1 | 10/2009 | Koshimizu et al. | 156/345.48 |
| 2009/0272492 A1 | 11/2009 | Katz et al. | |
| 2009/0277585 A1 | 11/2009 | Maebashi et al. | |
| 2009/0280040 A1* | 11/2009 | Park et al. | 422/186.05 |
| 2009/0305509 A1 | 12/2009 | Stevenson et al. | |
| 2009/0321019 A1 | 12/2009 | Chen et al. | |
| 2010/0008015 A1 | 1/2010 | Booth et al. | |
| 2010/0008016 A1 | 1/2010 | Onate et al. | |
| 2010/0065215 A1 | 3/2010 | Jeon et al. | |
| 2010/0072172 A1 | 3/2010 | Ui et al. | |
| 2010/0096076 A1 | 4/2010 | Hoffman et al. | |
| 2010/0098875 A1* | 4/2010 | Fischer et al. | 427/534 |
| 2010/0116788 A1 | 5/2010 | Singh et al. | |
| 2010/0116790 A1 | 5/2010 | Spitzl | |
| 2010/0140223 A1 | 6/2010 | Tyler et al. | |
| 2010/0147050 A1 | 6/2010 | Barth | |
| 2010/0196626 A1* | 8/2010 | Choi et al. | 427/569 |
| 2010/0218785 A1* | 9/2010 | Green et al. | 134/1.1 |
| 2010/0319852 A1 | 12/2010 | Brillhart et al. | |
| 2011/0061687 A1 | 3/2011 | Mikhaylichenko et al. | |
| 2011/0075313 A1 | 3/2011 | Comendant | |
| 2011/0100552 A1* | 5/2011 | Dhindsa et al. | 156/345.1 |
| 2011/0108524 A1 | 5/2011 | Dhindsa et al. | |
| 2011/0132542 A1* | 6/2011 | Iizuka | 156/345.33 |
| 2012/0000886 A1* | 1/2012 | Honda et al. | 216/24 |
| 2012/0003836 A1* | 1/2012 | Kellogg et al. | 438/710 |
| 2012/0055632 A1 | 3/2012 | de la Llera et al. | |
| 2012/0086541 A1 | 4/2012 | Kester | |
| 2013/0023064 A1 | 1/2013 | Marakhtanov et al. | |
| 2013/0059448 A1 | 3/2013 | Marakhtanov et al. | |
| 2013/0126475 A1 | 5/2013 | Dhindsa et al. | |
| 2013/0127124 A1 | 5/2013 | Nam et al. | |
| 2013/0133834 A1 | 5/2013 | Dhindsa | |
| 2013/0260567 A1 | 10/2013 | Marakhtanov et al. | |
| 2013/0340938 A1 | 12/2013 | Tappan et al. | 156/345.29 |
| 2014/0054268 A1 | 2/2014 | Chen et al. | |

(56) References Cited

U.S. PATENT DOCUMENTS

| | | | |
|---|---|---|---|
| 2014/0054269 A1 | 2/2014 | Hudson et al. | |
| 2014/0065835 A1 | 3/2014 | Kadkhodayan et al. | 438/710 |
| 2014/0087488 A1 | 3/2014 | Nam et al. | |

FOREIGN PATENT DOCUMENTS

| | | | |
|---|---|---|---|
| JP | 5144594 | 11/1993 | |
| RU | 2022917 | 11/1994 | |
| RU | 2056702 | 3/1996 | |
| RU | 2094961 | 10/1997 | |
| TW | 2010043099 A | 12/2010 | H05H 1/18 |
| WO | WO 0136703 A1 | 5/2001 | |

OTHER PUBLICATIONS

ISR PCT US2011/001174 dated Dec. 6, 2011.
ISR PCT US2011/001175 dated Nov. 29, 2011.
ISR PCT US2011/001176 dated Jan. 19, 2012.
ISR PCT US2012/063987 dated Jan. 28, 2013.
ISR PCT US2012/065080 dated Jan. 28, 2013.
ISR PCT US2012/065333 dated Jan. 28, 2013.
ISR PCT US2012/065677 dated Feb. 7, 2013.
ISR PCT US2012/065684 dated Jan. 28, 2013.
ISR PCT US2012/065949 dated Feb. 5, 2013.
ISR PCT US2012/65122 dated Mar. 25, 2013.
ISR PCT US2012/66467 dated Feb. 8, 2013.
Bera et al., "Control of Plasma Uniformity Using Phase Difference in a VHF Plasma Process Chamber," IEEE Transactions on Plasma Science, vol. 36, No. 4, Aug. 2008, p. 1366-1367.
ISR PCT/US2012/066333 dated Feb. 1, 2013, 8 pages.
ISR PCT/US2012/66302 dated Feb. 8, 2013, 7 pages.
Taiwan Search Report, App. No. 101144019, of Notification of Examination Opinions, 7 pages, issued Sep. 22, 2014.

* cited by examiner

PLASMA PROCESSING CHAMBER WITH FLEXIBLE SYMMETRIC RF RETURN STRAP

CLAIM OF PRIORITY

This application claims priority to U.S. Provisional Patent Application No. 61/563,545, filed Nov. 24, 2011, entitled "Plasma Processing Chamber with Flexible Symmetric RF Return Strap," which is herein incorporated by reference.

CROSS REFERENCE TO RELATED APPLICATIONS

This application is related to U.S. patent application Ser. No. 13/301,725, filed Nov. 21, 2011, entitled "TRIODE REACTOR DESIGN WITH MULTIPLE RADIOFREQUENCY POWERS," and to U.S. Provisional Patent Application No. 61/563,021, filed Nov. 22, 2011, entitled "SYSTEMS AND METHODS FOR CONTROLLING A PLASMA EDGE REGION," the disclosures of which are incorporated herein by reference.

BACKGROUND

1. Field of the Invention

The present embodiments relate to wafer processing apparatus, and more particularly, apparatus, methods, for processing a wafer in a wafer processing apparatus.

2. Description of the Related Art

The manufacturing of integrated circuits includes immersing silicon substrates (wafers) containing regions of doped silicon in chemically-reactive plasmas, where the submicron device features (e.g., transistors, capacitors, etc.) are etched onto the surface. Once the first layer is manufactured, several insulating (dielectric) layers are built on top of the first layer, where holes, also referred to as vias, and trenches are etched into the material for placement of the conducting interconnectors.

Non-uniform etching can adversely impact wafer yield. Moreover, as the size of the critical dimension shrinks with each new generation of devices, and as wafer sizes increase to facilitate production of higher numbers of devices from the same wafer, non-uniformity requirements become ever more stringent. Thus, controlling non-uniformity is key to enabling more advanced technology nodes to be produced in a cost-effective manner.

It is in this context that embodiments of the invention arise.

SUMMARY

Embodiments of the disclosure provide embodiments of a process chamber, used for processing semiconductor wafers. In one implementation, the process chamber includes a strap that couples a first part of a ground assembly with a second part of the ground assembly to complete a flexible ground path between the parts.

In one embodiment, a chamber for processing semiconductor wafers is disclosed. The chamber includes an electrostatic chuck having a surface for supporting a substrate. A ground assembly is provided that surrounds a periphery of the electrostatic chuck. The ground assembly includes a first annular part and a second annular part and a space between the first annular part and the second annular part. A conductive strap having flexibility is provided. The conductive strap is annular and has a curved cross-sectional shape with a first end and a second end. The conductive strap is disposed in the space such that the first end is electrically connected to the first annular part and the second end is electrically connected to the second annular part. The curved cross-sectional shape has an opening that faces away from the electrostatic chuck when the annular conductive strap is in the space.

In another embodiment, a chamber is disclosed. The chamber includes an electrostatic chuck having a surface for supporting a substrate. Also included is a focus ring assembly surrounding a periphery of the electrostatic chuck and a ground assembly surrounding a periphery of the focus ring assembly, The ground assembly includes a first annular part and a second annular part and a space between the first annular part and the second annular part. A conductive strap having flexibility is provided. The conductive strap is annular and has a curved cross-sectional shape with a first end and a second end. The conductive strap is disposed in the space such that the first end is electrically connected to the first annular part and the second end is electrically connected to the second annular part. The curved cross-sectional shape has an opening that faces away from the electrostatic chuck when the annular conductive strap is in the space.

In one embodiment, the chamber is provided, wherein the conductive strap includes a plurality of fingers, and where each finger extends between the first end and the second end of the curved cross-sectional shape.

In one embodiment, the chamber is provided, wherein the first end and second end of the curved cross-sectional shape are respectively clamped to the first and second annular parts of the ground assembly.

In one embodiment, the chamber is provided, wherein the first annular part of the ground assembly is configured to move vertically and the conductive strap having flexibility will compress when the first annular part moves down and extend when the first annular part moves up, wherein first end of the curved cross-sectional shape is clamped by screws to the first annular part and the second end of the curved cross-sectional shape is clamped by screws to the second annular part.

In one embodiment, the chamber is provided, wherein the conductive strap is defined from sheet metal copper.

In one embodiment, the chamber is provided, wherein the conductive strap provides a conductive path between the first annular part that is proximate to a region of plasma and a second annular part that couples to ground of a chamber wall of the chamber.

In one embodiment, the chamber is provided, wherein the first annular part has an L shape cross-section and the second annular part has an L shape cross-section, wherein a long side of the L shapes define tubular portions and a short side of the L shapes define extensions that face away from the electrostatic chuck, wherein the space is between the short sides of the L shapes that define the extensions.

In one embodiment, the chamber is provided, wherein the tubular portions of the first and second annular portions are parallel to dielectric rings of a focus ring assembly, the focus ring assembly immediately surrounding the electrostatic chuck and the ground assembly surrounding the focus ring assembly.

In one embodiment, the chamber is provided, wherein the first and second annular portions of the ground assembly are disposed below a perforated plasma confinement ring.

In one embodiment, the chamber is provided, wherein RF power is supplied to the electrostatic chuck and RF current is returned at least partially by the ground assembly and the conductive strap.

DESCRIPTION

Figure 1:
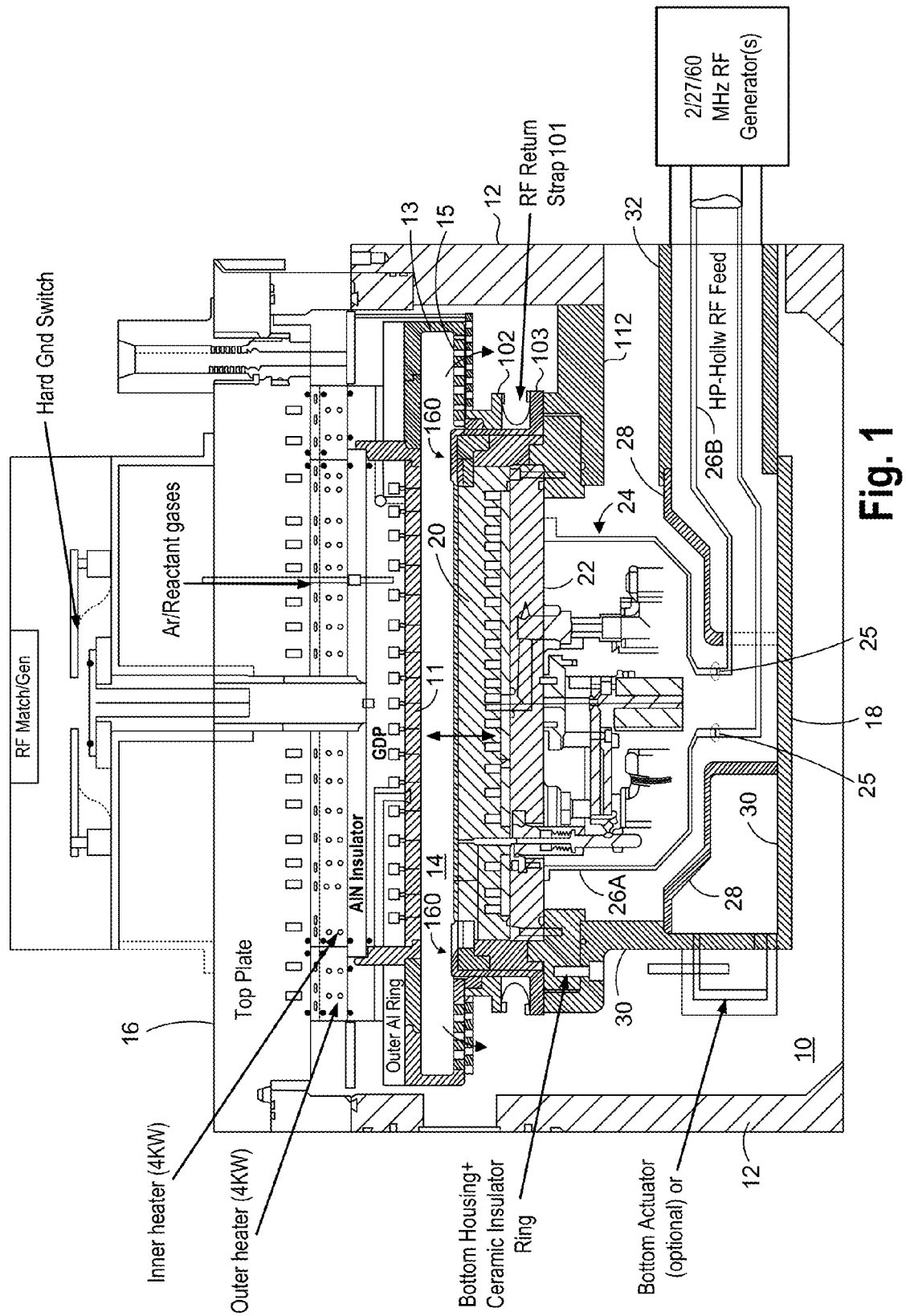
FIG. 1 illustrates a cross section of a plasma reactor, in accordance with an embodiment of the invention.

Embodiments of the disclosure provide embodiments of a process chamber, used for processing semiconductor wafers. In one implementation, the process chamber is referred to as a reactor. One configuration includes an additional electrode opposite to the bottom electrode, and it is surrounded by a substantially symmetric RF ground electrode. In one embodiment, a low radio frequency (RF) power on the top electrode controls the ion energy on the top chamber as well as the reactor walls. This helps to control the plasma chemistry and enable step to step control to adjust the power setting in the recipes.

To further control the temperature on the top electrode surface, a dual zone temperature control is designed in the top region of the reactor, such that inner and outer top electrode temperatures can be independently controlled during the process. Still further, a multi-zone gas feed system is implemented to inject various process gas ratios and a tuning gas through various zones to achieve the desired radial uniformity.

Still yet, in another embodiment, a peripheral RF feed at the bottom end in designed to improve the azimuthal etch rate uniformity at high RF frequency RF delivery. The AC and DC cables to ESC (electrostatic chuck) heater and ESC electrode are routed through the RF feed and terminated in the integrated RF filter at the RF match.

In one embodiment, a symmetric RF ground return is implemented through a C-shape flexible metal unit, e.g., RF return strap 101. This metal strap allows for gap adjustment during the process, while maintain the RF return path between top and bottom electrodes evenly distributed. During gap adjustment, the RF return strap 101 will flex to bend in a more closed C shape or unbend to be a more open C shape. Generally, the C shape has a curved shape with an opening, wherein the opening may be closed more or opened more when moved by attachment points or ends of the curved shape. As shown in FIGS. 1-4, the RF return strap 101 surrounds the periphery of the electrostatic chuck, connected to grounded components, providing for a more even path to ground that is symmetrically distributed around the electrostatic chuck.

The RF return strap, in one embodiment, is made from copper material, that is flexible to the degree of movement of parts that are coupled between ends of the strap. In one embodiment, the copper is sheet metal copper that is flexible and can be punched into shape to define the fingers or strips. In other embodiments, the copper can be formed or machined into shape. In one embodiment, the parts are conductive metal parts, and the strap is connected to one part at one end of the strap and another part at another end of the strap. The contact points around the perimeter of the lower electrode provide for an even distribution of the return path to ground from the chamber and back down to the RF supplies.

It should be appreciated that the present embodiments can be implemented in numerous ways, such as a process, an apparatus, a system, a device, or a method. Several embodiments are described below.

Exciting an electric field between two electrodes is one of the methods to obtain RF gas discharge in an etching chamber. When an oscillating voltage is applied between the electrodes, the discharge obtained is referred to as a capacitive coupled plasma (CCP) discharge.

Plasma can be created utilizing stable feedstock gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface, and producing volatile molecules, which can be pumped away. When plasma is created, the positive ions are accelerated from the plasma across a space-charge sheath separating the plasma from the walls, to strike the wafer surface with enough energy to remove material from the surface of the wafer.

In one embodiment, Fluorocarbon gases, such as $CF_4$ and $C-C_4F_8$, are used in the dielectric etch process for their anisotropic and selective etching capabilities, but the principles described herein can be applied to other plasma-creating gases. The Fluorocarbon gases are readily dissociated into smaller molecular and atomic radicals. These chemically reactive by-products etch away the dielectric material, which in one embodiment can be $SiO_2$ or SiOCH for low-k devices. The resulting process of etching can be viewed as one of many etching steps utilized to make integrated circuit devices. The integrated circuit devices are then packaged into a variety of electronic devices. The devices can also be defined as finished integrated circuit devices.

FIG. 1 illustrates a cross section of a plasma reactor, in accordance with an embodiment of the invention. The reactor includes a surrounding chamber 10 defined by an surrounding chamber wall 12, and a plasma confinement region 14 defined by a top electrode assembly 16 and a lower chuck assembly 18. The chuck assembly 18 includes an electrostatic chuck 20 which provides a substrate support surface on its top side, and provides for electrostatic clamping of a substrate to its substrate support surface. A facility plate 22 is coupled to the electrostatic chuck 20 on a side opposite the substrate support surface (e.g., for supporting a wafer). Various facility components are coupled to the facility plate 22, such as components relating to heating, cooling, control of lift pins, and electrostatic clamping.

As shown, the top electrode assembly 16 includes a showerhead 11 for feeding process gas into the plasma confinement region 14. The top electrode assembly also includes a shroud 13, which is connected to the top electrode assembly 16 and engages with the chuck assembly 18 to define the plasma confinement region 14. Perforations are defined for gas flow exiting the plasma confinement region 14. The perforations are defined in a ring 15 that functions to confine plasma in the region 14, while still allowing gas flow.

A hollow RF feed 24 is coupled to a peripheral portion of the facility plate 22, so as to deliver RF power to the edge of the facility plate 22. This configuration enables the RF current to bypass the interior portion of the facility plate 22, so that components coupled to the facility plate are not in the path of RF current. In this manner, RF delivery to a substrate situated on the chuck assembly is achieved with high azimuthal uniformity.

The hollow RF feed 24 includes a first portion 26A which connects to the facility plate 22, and a second portion 26B which extends laterally away from the chuck assembly 18. As shown in the illustrated embodiment, the hollow RF feed 24 joins to the periphery of the facility plate 22 at one end, while extending away from the facility plate to a RF source at its opposite end. The first portion 26A which connects to the facility plate is a bowl-shaped section having a substantially larger diameter than the second portion 26B, which is a tubular section extending away from the chuck assembly. The second portion 26B connects to a hole in the bowl-shaped section defined by the first portion 26A at an interface 25. Thus, various child facility components coupled to the facility plate are contained within the interior of the first portion 26A of the hollow RF feed.

Additionally, a ground shield 28 is provided as part of the chuck assembly 18. The ground shield 28 facilitates a substantially symmetric RF return shape for current to flow thereon. The ground shield 28 is defined so as to surround the region of the hollow RF feed 24 where the first portion 26A and the second portion 26B are connected. Thus, the ground shield 28 defines a bather between the first portion 26A and the second portion 26B of the hollow RF feed 24. The ground shield 28 is connected to the chuck assembly wall 30, from which a RF ground adapter tube 32 extends to ground. Together, the chuck assembly wall 30, the ground shield 28, and the RF ground adapter tube 32 from a return path for the RF current delivered via the hollow RF feed tube 24. It will be noted that part of the second portion 26B of the hollow RF feed is defined within the interior of the RF ground adapter tube 32. This part of the second portion 26B of the hollow RF feed and the RF ground adapter tube 32 together define a coaxial section.

FIG. 1 further shows the RF return strap 101, which is configured in a C-shape configuration, in accordance with one embodiment of the present invention. As shown, the C-shape of the RF return strap 101 is designed to fit within and provide electrical contact between a conductive part 102 of the upper electrode assembly and a conductive part 103 of the lower electrode. Conductive parts 102 and 103 form part of a ground assembly that surrounds the electrostatic chuck. Conductive part 102 is first annular part and Conductive part 103 is a second conductive part. The ground assembly is electrically insulated from the electrostatic chuck by one or more dielectric parts.

In the configuration of FIG. 1, the ground assembly includes parts 102 and 103, and is configured to surround the electrostatic chuck 20 on a periphery side wall that is outside of the focus ring assembly 160. The focus ring assembly 160 surrounds the electrostatic chuck 20. The focus ring assembly 160 can include a quartz ring 160a that faces the plasma in region 14. The focus ring assembly 160 will also include a number of dielectric rings 160c (see FIG. 3) that sit below the quartz ring 160b and electrically isolate the electrostatic chuck 20 from part 103, which is a conductor that is coupled to ground, and forms part of the ground assembly. Conductive parts 102 and 103 have an annular shape that has a diameter that is larger than the electrostatic chuck (including the insulating parts that are proximate to the electrostatic chuck). The annular shape allows the conductive parts 102 and 103 to provide a uniform and symmetric connection for the RF return strap 101 to ground.

Figure 3:
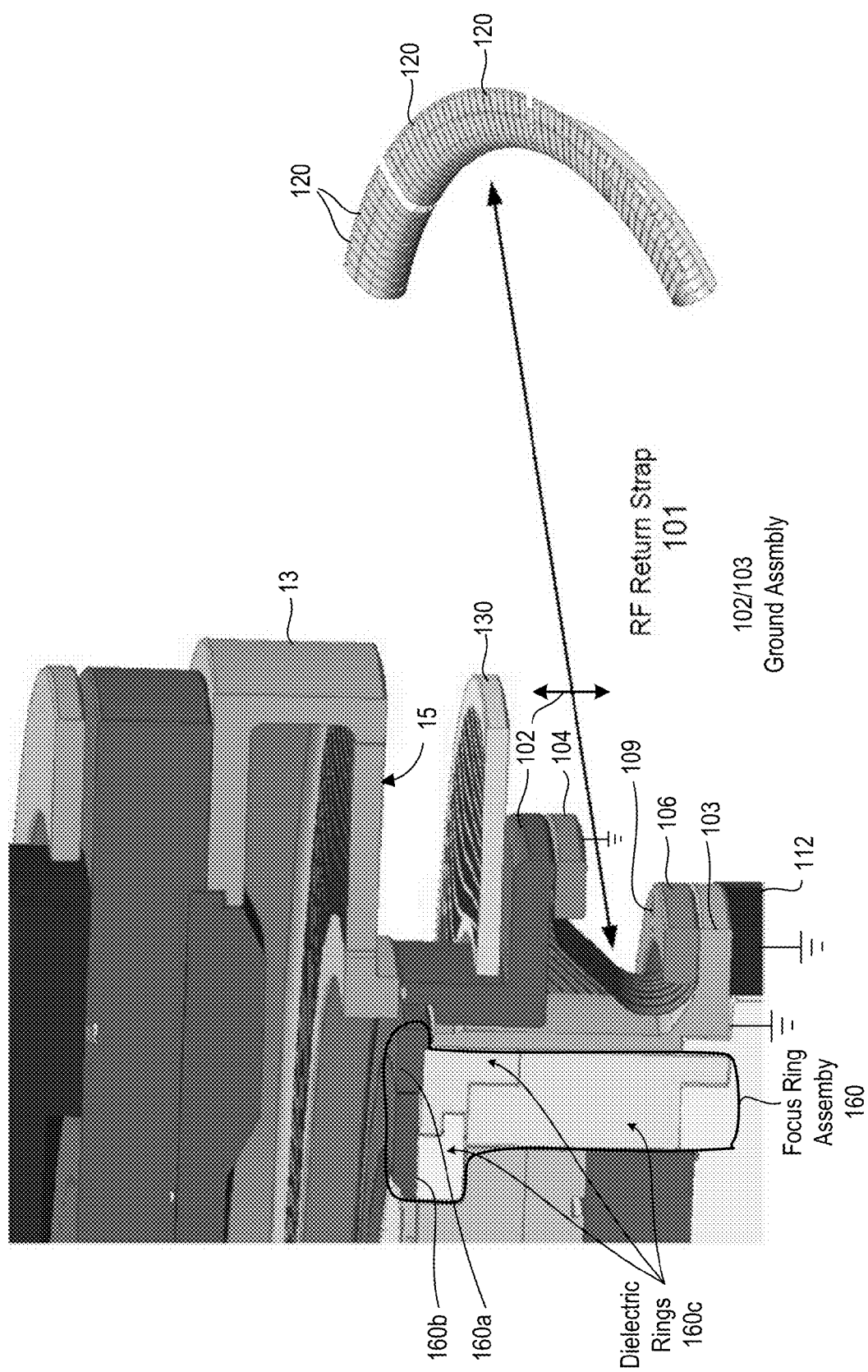
FIG. 3 illustrates another detailed diagram of the RF return strap, in accordance with one embodiment.

The RF return strap 101 is connected to conductive part 103 by a clamping structure 106 and conductive part 102 by a clamping structure 104. The clamping structures can be, in one embodiment, a ring shape structure that compresses the RF return strap to the conductive parts 102 and 103 to secure good electrical connection. The ring shape structure can be attached or clamped by screws 109 (see FIG. 3), which facilitate the clamping pressure. The screws can be directly applied to the strap or the strap can be clamped or connected by an intermediate block that gets screwed, as shown in FIG. 3.

As noted above, the RF return strap is defined from a conductive material, such as copper, that provides a plurality of contact points 121 all the way around the circumference between the top and bottom contact surfaces of the RF return strap. In one embodiment, the number of contact points along the perimeter circumference where the C-shape strap contacts the conductive parts can be in the range of, between about 10 and 500 contact points, or between about 50 and 300 contact points, or between about 100 and 200 contact points, or about 150 contact points. In still another embodiment, the contact points can be connected together along the circumference, making for one single contact point for the strap. In such a design, the strap can still have gaps between strip sections 120 (see strap detail in FIG. 2), but the top and bottom of each strip section can be joined together at locations 122.

The RF return strap 101 is designed to provide a return path to ground from the plasma being generated within the plasma confinement region 14 shown in FIG. 1. The return path, is designed to be between the plasma confinement region 14, up through the top electrode, along the C-shroud (e.g., made of silicon or other conductive material), to conductive part 102, down through the RF return strap 101, to conductive part 103, and to the conductive housing of the bottom electrode. In one embodiment of the present invention, the chamber wall 12 is grounded. As shown, the chamber is provided with RF power to the bottom electrode, and the RF power can be provided by way of one or more RF power generators. In one embodiment, three RF power generators can be provided to deliver power at three different frequencies. The RF power can be delivered at, for example, 2 MHz, 27 MHz, 60 MHz, or combinations thereof.

Additionally, the chamber can be provided with another RF power that couples to the top electrode, or the top electrode can be grounded. When RF power couples to the top electrode, in one embodiment, the power is provided by a low frequency power generator. In one embodiment, the RF power is selected from a range that is between 20 kHz and 2 MHz. In one embodiment, the RF power is set to about 400 kHz. In still another embodiment, the top RF power can be coupled to a switch, that can provide a hard ground switch in case the top RF power is to be completely turned off and grounded, and the chamber is designed to run only with the bottom RF power active. Of course, the configuration will depend on the process parameters and the target process application.

Figure 2:
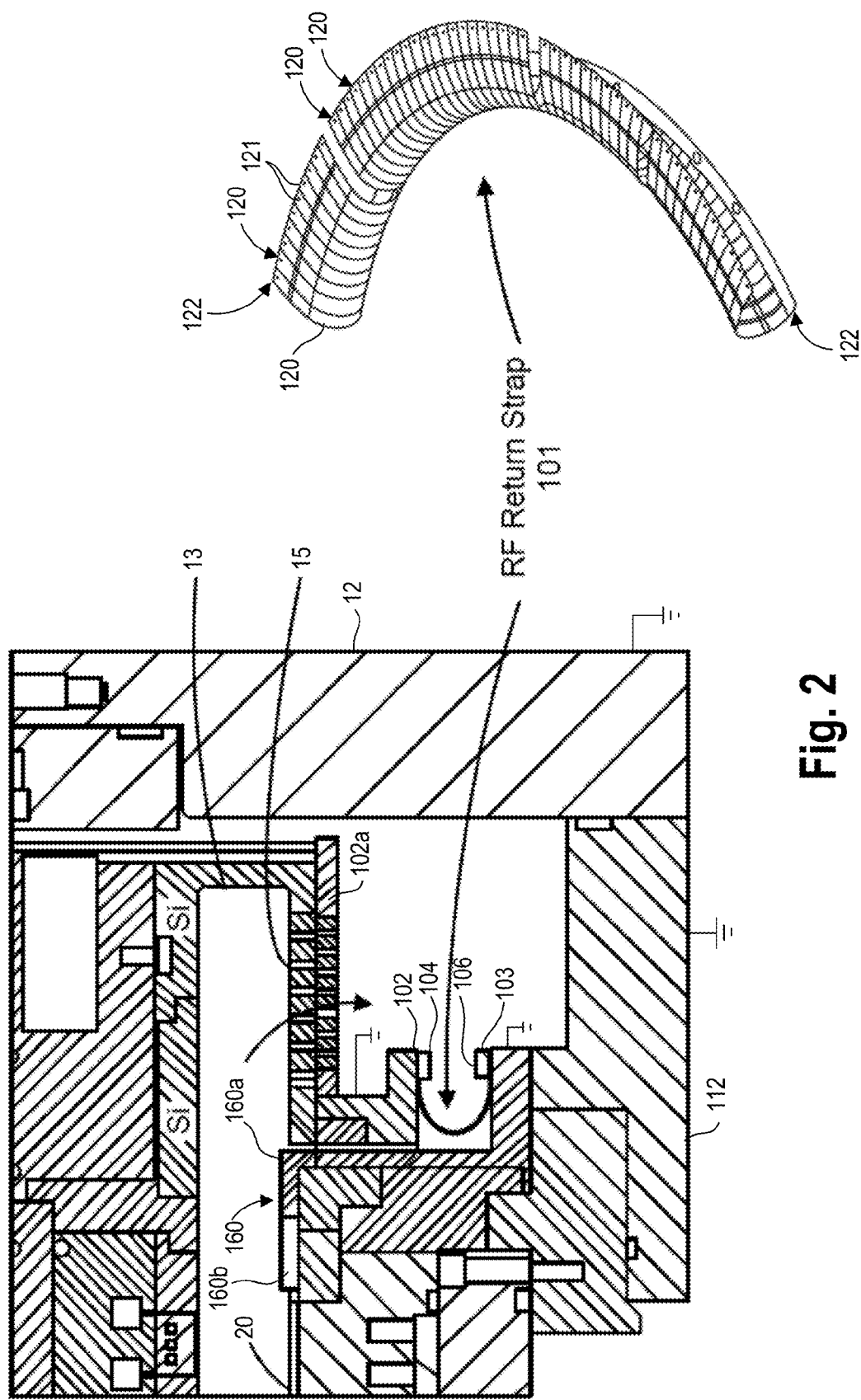
FIG. 2 illustrates a more detailed illustration of the RF return strap and its contoured shape that is flexible and designed to fit between two conductive parts of the chamber.

FIG. 2 illustrates a more detailed illustration of the RF return strap 101 and its contoured shape that is flexible and designed to fit between two conductive parts 102 and 103 of the chamber, which define the ground assembly. The ground assembly is also shown connected to ground support 112, that is connected to the chamber wall 12, which is also grounded. Conductive part 103 of the ground assembly has an L shape (in its cross-section), wherein the strap is connected to the bottom of the L and the back of the L extends up to and beside the focus ring assembly 160. The part 102 also has a smaller L shape (in its cross-section) that extends up to ring 15 and provides a connection point to the strap 101 at clamping structure 104. Between the two L shape cross-sections of parts 102 and 103, the strap will be disposed in the C shape configuration.

The back of the L shape of part 103, due to its annular construction, can be viewed as a tubular portion, while the bottom part of the L that extends out can be viewed as an extension that extends away from the electrostatic chuck. The back of theL shape of part 102, due to its annular construction, can also be viewed as a tubular portion, while the bottom part of the L that extends out can be viewed as an extension that extends away from the electrostatic chuck. Between the extensions of part 102 and 103, will be defined the space where the strap can be connected. Part 102 can, in one embodiment, move up and down, this flexibility of the strap 101 allows for this movement, while still maintaining electrical conduction for ground.

Parts 102 and 103, which define the ground assembly, will have an annular shape to allow the parts to substantially surround an outer periphery of the electrostatic chuck 20, in a location that is outside and partially below the focus ring assembly 160. The focus ring assembly 160, among other parts, includes a quartz ring 160a surrounds a hot edge ring 160b. The hot edge ring 160b is designed to be placed proximate to the support surface that will accept a wafer over the electrostatic chuck 20. FIG. 2 shows the surface of the electrostatic chuck 20, but does not show a wafer placed thereon. When a wafer is placed over the support surface of the electrostatic chuck 20, the top surface of the wafer will be about coplanar with the top surface of the hot edge ring 160b and the quartz ring 160a of the focus ring assembly 160.

As shown, by placing the RF return strap 101 in a C configuration or shape, it is possible to provide flexibility for chamber parts to move up and down, while maintaining electrical contact for the return path to ground. Conductance of gases out of the process region, through the perforated plasma confinement ring 15, can still occur without having a strap obstruct the path of flow. The strap will not obstruct the path of flow (i.e., conductance of gas), as the strap substantially fits within, and is sandwiched between conductive parts 102 and 103 of the chamber. In this figure, it can also be seen that conductive part 102, which is grounded, is also conductive upward and toward 102a. This configuration allows placement of part 102 near the perforated plasma confinement ring 15, and also provides a surface upon which the plasma may couple to ground through the ring 15.

FIG. 3 illustrates another detailed diagram of the RF return strap 101, when coupled to conductive parts 102 and 103 of the chamber. The conductive parts 102 and 103 of the chamber allow the strap to be clamped with clamping conductive blocks 104 and 106, while still maintaining electrical conductance between the top and parts 102 and 103. In one embodiment, the RF return strap 101 is made of copper. The copper used may be from thin copper sheets that are formed to hold a shape or return to a shape if made or formed thick enough to retain the curved shape, yet still be flexible enough to move/flex when compressed or extended. In another embodiment, the RF return strap 101 can be made of another conductive material, so long as RF power can be communicated between two conductive pieces of the chamber to allow return of RF power to ground.

In FIG. 3, ring plate 130 is provided, which is configured to be placed closer or way from perforated ring 15. Ring plate 130 may be coupled to part 102, and thus can be lowered to provide more gas conductance through the perforations of ring 15 or can be provided in an up position that is closer to ring 15 to throttle gas flow. When part 102 moves up and down, the RF return strap 101 is allows to flex, while still providing good electrical conductance.

Part 102, which is coupled to a side of strap may be designed to move during operation or after operation in order to adjust the flow of gases out of the chamber during processing. As illustrated, the strap has a plurality of fingers (strip sections 120) all the way around the strap that surrounds, or substantially surrounds the lower electrode. The plurality of fingers assist in providing a maximum amount of electrical conductance between the two parts 102/103, but also provide for air flow between respective sides of the strap material. The strap, being flexible, can therefore move with parts of the chamber, and will provide for easy removal when applied by attachment blocks 104 and 106. The attachment blocks 104 and 106, being attached by screws to parts 102 and 103, can be removed for easy replacement of the RF return strap if wear dictates replacement or cleaning is needed.

Figure 4:
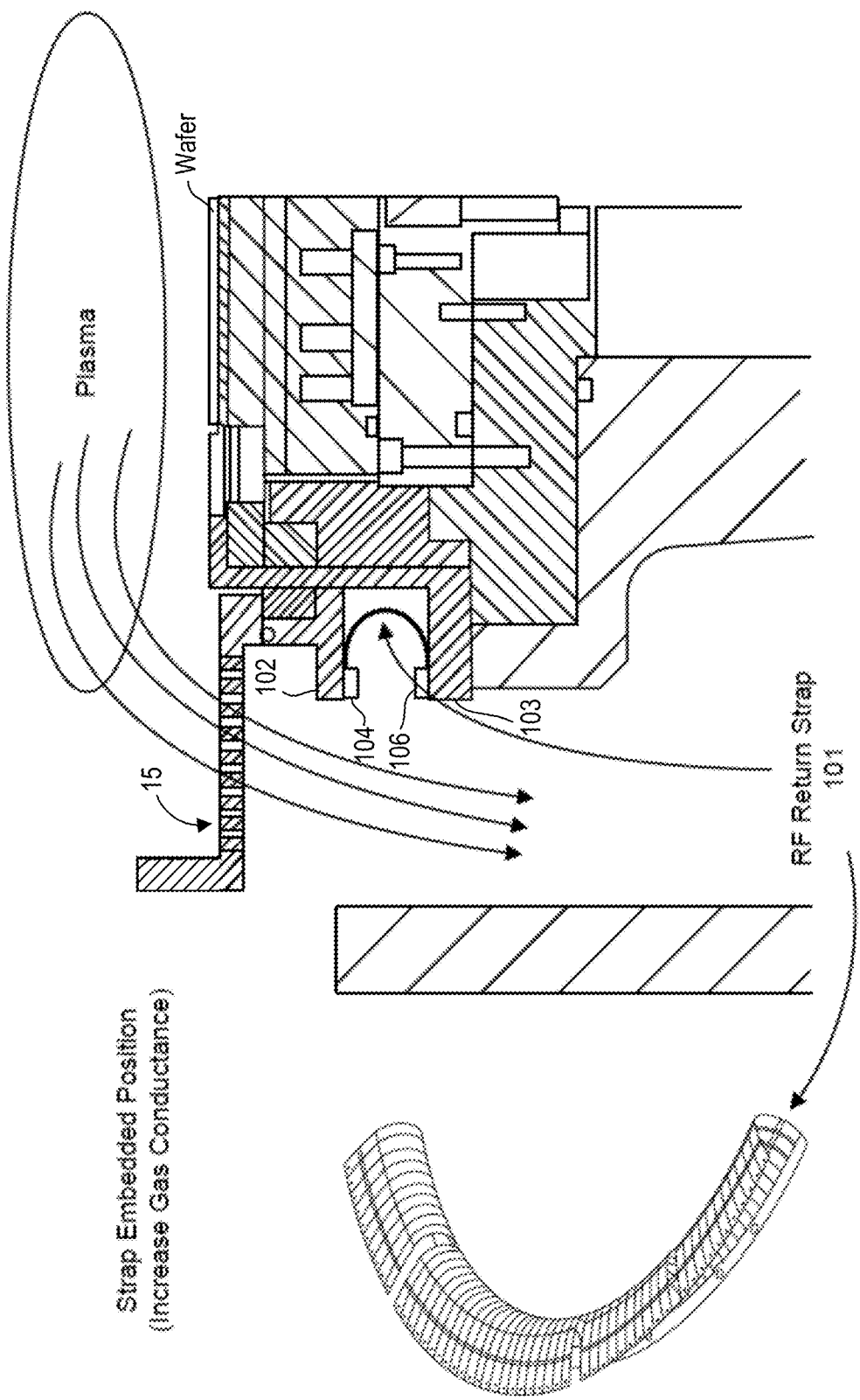
FIG. 4 illustrates another cross-sectional view of the RF return strap, in accordance with one embodiment.

FIG. 4 illustrates another cross-sectional view of the RF return strap 101. In this illustration, the plasma processing occurring within the chamber will, based on configurations of the chamber, be allow to flow gases out of the chamber. By having the RF return strap 101 tucked into a flexible C-shape, between two conductive parts 102 and 103 of the chamber, the flow of gases through the perforated plasma confinement ring will not be substantially obstructed. Obstruction of gas flow may cause negative processing effects, which can affect uniformity of etching.

Figure 5:
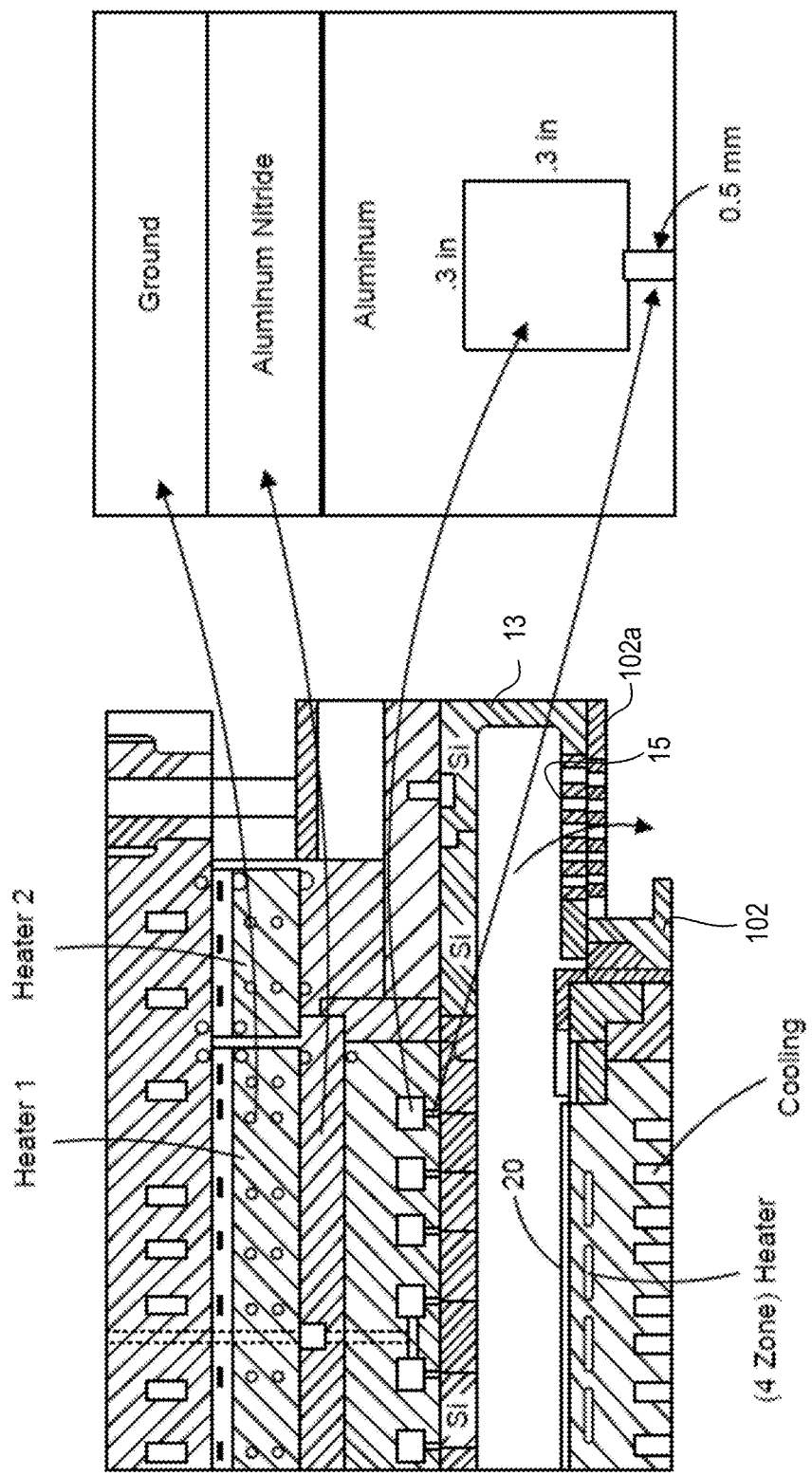
FIG. 5 shows another detailed diagram of the upper electrode and a partial illustration of the perforated plasma confinement ring area, in accordance with one embodiment.

FIG. 5 shows another detailed diagram of the upper electrode and a partial illustration of the perforated plasma confinement ring 15. The portion of the upper electrode includes a plurality of conduits that allow for gases to flow through a showerhead region of the upper electrode. In one embodiment, openings into the plasma region from the showerhead are designed to be minimized, so as to prevent plasma ignition within the showerhead of the upper electrode. In this illustration, the upper electrode section, where the gases are flown to the showerhead, is defined from an aluminum material. Above the aluminum material is an aluminum nitride material, and above the aluminum nitride material is a grounded region.

In one embodiment, the top electrode will also include an inner and outer heater. The inner heater is identified as heater 1, and the outer heater is identified as heater 2. By providing a separate heater for the inner region of the chamber and an outer region of the chamber, it is possible to control the processing parameters more closely within the plasma processing chamber. FIG. 1 provides more detailed illustration of the placement of the inner heater and the outer heater.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A chamber for processing semiconductor wafers, comprising:
   an electrostatic chuck having a surface for supporting a substrate;
   a ground assembly surrounding a periphery of the electrostatic chuck, the ground assembly including a first annular part and a second annular part and a space between the first annular part and the second annular part; and a conductive strap having flexibility, the conductive strap being annular and having a curved cross-sectional C-shape with a first end and a second end, the conductive strap disposed in the space such that the first end is electrically connected to the first annular part and the second end is electrically connected to the second annular part, wherein the curved cross-sectional C-shape has an opening that faces away from the electrostatic chuck and toward a surround wall of the chamber and the conductive strap remains within the space;

wherein the first annular part has an L shape in cross-section and the second annular part has an L shape in cross-section, wherein a long side of the L shapes define a tubular portion and a short side of the L shapes define extensions that are parallel to each other and the short side of both of the L shapes of the first and second annular parts face in a same direction that is away from the electrostatic chuck and toward the surround wall of the chamber, wherein the space is between the short sides of the L shapes that define the extensions;

wherein the first and second annular parts of the ground assembly are disposed below a perforated plasma confinement ring, and the L shape of the first annular part is configured to move vertically up toward the perforated plasma confinement ring and move vertically down away from the perforated plasma confinement ring.

2. The chamber of claim 1, wherein the conductive strap includes a plurality of fingers, where each finger extends between the first end and the second end of the curved cross-sectional C-shape.

3. The chamber of claim 1, wherein the first end and second end of the curved cross-sectional C-shape are respectively clamped to the first and second annular parts of the ground assembly.

4. The chamber of claim 1, wherein the conductive strap having flexibility will compress when the first annular part moves vertically down and extend when the first annular part moves vertically up, wherein first end of the curved cross-sectional C-shape is clamped by screws to the first annular part and the second end of the curved cross-sectional C-shape is clamped by screws to the second annular part.

5. The chamber of claim 1, wherein the conductive strap is defined from sheet metal copper.

6. The chamber of claim 1, wherein the conductive strap provides a conductive path between the first annular part that is proximate to a region of plasma and the second annular part that couples to ground of a chamber wall of the chamber.

7. The chamber of claim 1, wherein the tubular portion of the first and second annular parts are parallel to dielectric rings of a focus ring assembly, the focus ring assembly immediately surrounding the electrostatic chuck and the ground assembly surrounding the focus ring assembly.

8. The chamber of claim 1, wherein RF power is supplied to the electrostatic chuck and RF current is returned at least partially by the ground assembly and the conductive strap.

9. A chamber, comprising:

an electrostatic chuck having a surface for supporting a substrate;

a focus ring assembly surrounding a periphery of the electrostatic chuck;

a ground assembly surrounding a periphery of the focus ring assembly, the ground assembly including a first annular part and a second annular part and a space between the first annular part and the second annular part; and a conductive strap having flexibility, the conductive strap being annular and having a curved cross-sectional C-shape with a first end and a second end, the conductive strap disposed in the space such that the first end is electrically connected to the first annular part and the second end is electrically connected to the second annular part, wherein the curved cross-sectional C-shape has an opening that faces away from the electrostatic chuck and toward a surrounding wall of the chamber and the conductive strap remains within the space;

wherein the first annular part has an L shape in cross-section and the second annular part has an L shape in cross-section, wherein a long side of the L shapes define a tubular portion and a short side of the L shapes define extensions that are parallel to each other and the short side of both of the L shapes of the first and second annular parts face in a same direction that is away from the electrostatic chuck and toward the surrounding wall of the chamber, wherein the space is between the short sides of the L shapes that define the extensions;

wherein the first and second annular parts of the ground assembly are disposed below a perforated plasma confinement ring that provides for conductance of gases out of a process volume of the chamber, the conductive strap remaining within the space avoids obstruction to the conductance of gases out of the process volume during operation;

wherein the L shape of the first annular part is configured to move vertically up toward the perforated plasma confinement ring and move vertically down away from the perforated plasma confinement ring.

10. The chamber of claim 9, wherein the conductive strap includes a plurality of fingers, where each finger extends between the first end and the second end of the curved cross-sectional C-shape.

11. The chamber of claim 9, wherein the first end and second end of the curved cross-sectional C-shape are respectively clamped to the first and second annular parts of the ground assembly.

12. The chamber of claim 9, wherein the conductive strap having flexibility will compress when the first annular part moves vertically down and extend when the first annular part moves vertically up, wherein first end of the curved cross-sectional C-shape is clamped by screws to the first annular part and the second end of the curved cross-sectional C-shape is clamped by screws to the second annular part.

13. The chamber of claim 9, wherein the conductive strap is defined from sheet metal copper.

14. The chamber of claim 9, wherein the conductive strap provides a conductive path between the first annular part that is proximate to a region of plasma during processing and the second annular part that couples to ground of a chamber wall of the chamber.

15. The chamber of claim 9, wherein the tubular portion of the first and second annular parts are parallel to dielectric rings of the focus ring assembly, the focus ring assembly immediately surrounding the electrostatic chuck and the ground assembly surrounding the focus ring assembly.

16. The chamber of claim 9, wherein an etching operation is performed by the chamber to make at least one aspect of a finished integrated circuit device.

17. The chamber of claim 1, wherein the perforated plasma confinement ring provides for conductance of gases out of a process volume of the chamber, the conductive strap remaining within the space avoids obstruction to the conductance of gases out of the process volume during operation.

* * * * *